US007326851B2

(12) United States Patent
Sterzel et al.

(10) Patent No.: US 7,326,851 B2
(45) Date of Patent: Feb. 5, 2008

(54) PB-GE-TE-COMPOUNDS FOR THERMOELECTRIC GENERATORS OR PELTIER ARRANGEMENTS

(75) Inventors: Hans-Josef Sterzel, Dannstadt-Schauernheim (DE); Klaus Kühling, Mutterstadt (DE); Mercouri G. Kanatzidis, East Lansing, MI (US); Duck-Young Chung, East Lansing, MI (US)

(73) Assignees: BASF Aktiengesellschaft, Ludwigshafen (DE); Michigan State University, East Lansing, MI (US)

( * ) Notice: Subject to any disclaimer, the term of this patent is extended or adjusted under 35 U.S.C. 154(b) by 771 days.

(21) Appl. No.: 10/411,320

(22) Filed: Apr. 11, 2003

(65) Prior Publication Data

US 2004/0200519 A1    Oct. 14, 2004

(51) Int. Cl.
*H01L 35/16* (2006.01)
(52) U.S. Cl. .................. 136/238; 136/239; 252/62.3 T
(58) Field of Classification Search ................ 136/238, 136/239; 252/62.3 T
See application file for complete search history.

(56) References Cited

U.S. PATENT DOCUMENTS 5,448,109 A    9/1995  Cauchy
6,225,550 B1   5/2001  Hornbostel et al.

FOREIGN PATENT DOCUMENTS

DE    101 42624    4/2003
EP    1 102 334    5/2001

OTHER PUBLICATIONS

Partin, D.L. "Growth of lead-germanium-telluride thin film structures by molecular beam epitaxy" J. Vac. Sci. Technol., 21(1), May/Jun. 1982. p. 1-5.*
Choi, J.-S. et al, "Thermoelectric Properties of n-Type (Pb1-x Gex)Te Fabricated by Hot Pressing Method" Proc. 16th International Conference on Thermoelectrics, 228-231. (1997).*
Derwent 2001-426994/46.

* cited by examiner

*Primary Examiner*—Nam Nguyen
*Assistant Examiner*—Jeffrey Barton
(74) *Attorney, Agent, or Firm*—Novak Druce & Quigg, LLP

(57) ABSTRACT

A thermoelectrically active p- or n-conductive semiconductor material is constituted by a ternary compound of the general formula (I)

$$(Pb_{1-x}Ge_x)Te \quad (I)$$

Figure 1:
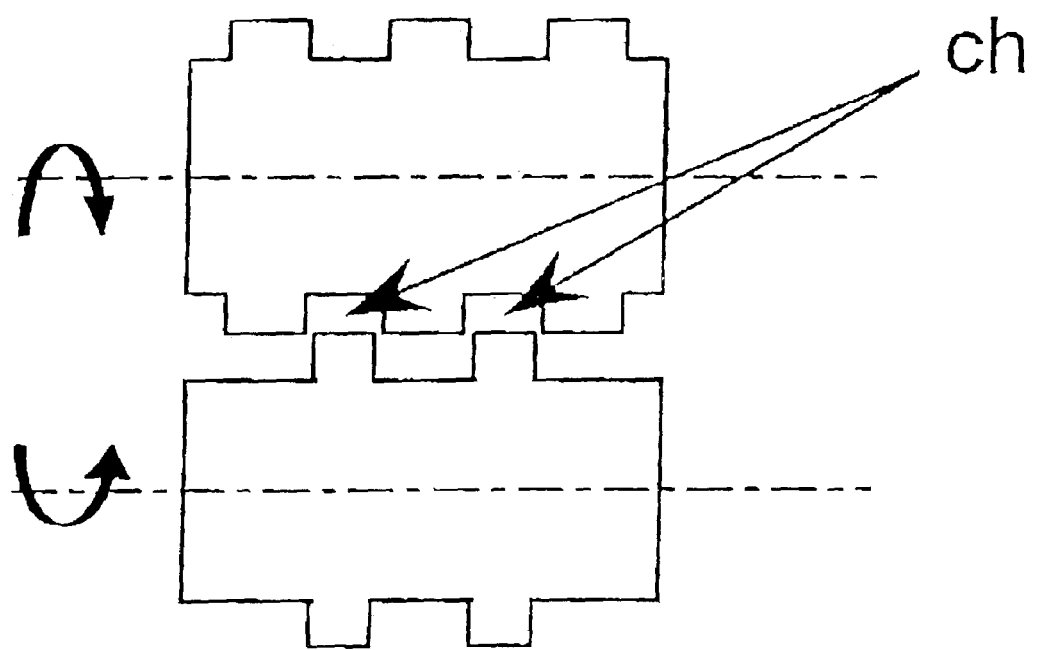

with x value from 0.16 to 0.5,
wherein 0 to 10% by weight of the ternary compound may be replaced by other metals or metal compounds, wherein the semiconductor material has a Seebeck coefficient of at least ±200 μV/K at a temperature of 25° C.

7 Claims, 1 Drawing Sheet

PB-GE-TE-COMPOUNDS FOR THERMOELECTRIC GENERATORS OR PELTIER ARRANGEMENTS

The invention relates to Ge—Pb—Te-compounds (Ge—Pb-tellurides) as thermoelectrically active materials, as well as to generators and Peltier arrangements containing them.

Thermoelectric generators per se have been known for a long time. p- or n-doped semiconductors, which are heated on one side and are cooled on the other side, transport electrical charges through an external circuit, with electrical work being done at a load in the circuit. The efficiency achieved in this case for the conversion of heat into electrical energy is limited thermodynamically by the Carnot efficiency. For instance, with a temperature of 1000 K on the hot side and 400 K on the "cold" side, an efficiency of (1000-400): 1000=60% would be possible. Unfortunately, efficiencies of only up to 10% have been achieved to date.

On the other hand, if a direct current is applied to such an arrangement, then heat will be transported from one side to the other. Such a Peltier arrangement works as a heat pump and is therefore suitable for the cooling of equipment parts, vehicles or buildings. Heating by means of the Peltier principle is also more favorable than conventional heating, because the quantity of heat transported is always greater than corresponds to the energy equivalent which is supplied.

A good review of effects and materials is given e.g. by Cronin B. Vining, ITS Short Course on Thermoelectricity, Nov. 8, 1993, Yokahama, Japan.

Thermoelectric generators are currently used in space probes for the generation of direct currents, for the cathodic corrosion protection of pipelines, for the energy supply of lighted and radio buoys, and for the operation of radios and television sets. The advantages of thermoelectric generators are that they are extremely reliable, they work irrespective of atmospheric conditions such as humidity, and no material transport susceptible to disruption takes place, instead only charge transport; the fuel is burned continuously—and catalytically without a free flame—so that minor amounts of CO, $NO_x$ and unburned fuel are released; it is possible to use any fuels from water through natural gas, gasoline, kerosene and diesel to biologically produced fuels such as rapeseed oil methyl ester.

Thermoelectric energy conversion therefore fits in extremely flexibly with future requirements such as hydrogen economy or energy production from regenerative energies.

An especially attractive application could involve use for conversion into electrical energy in electrically powered vehicles. No modification to the existing network of the fuelling stations would need to be carried out. For such an application, however, efficiencies in excess of 30% would be necessary.

The conversion of solar energy directly into electrical energy could also be very attractive. Concentrators such as parabolic collectors can focus the sun's energy with efficiencies of 95-97% onto thermoelectric generators, so that electrical energy can be produced.

Higher efficiencies, however, are necessary for use as a heat pump.

It is an object of the present invention to provide thermoelectric active materials which permit higher efficiencies than previously. A characteristic of thermoelectric materials is the so-called Z factor (figure of merit)

$$Z = \frac{\alpha^2 * \sigma}{K}$$

with $\alpha$ being the Seebeck coefficient, $\sigma$ being the electrical conductivity and K being the thermal conductivity.

A more accurate analysis is the efficiency as $\eta$ $$\eta = \frac{T_{high} - T_{low}}{T_{high}} * \frac{M - 1}{M + \frac{T_{low}}{T_{high}}}$$

with $M=[1+Z/2(T_{high}+T_{low})]^{1/2}$ (cf. Mat. Sci. and Eng. B29 (1995) 228).

The aim is therefore to provide a material having a maximally high value for Z and high achievable temperature difference. In terms of solid-state physics, many problems need to be overcome in this case:

A high $\sigma$ entails high electron mobility in the material; i.e. electrons (or holes in the case of p-conducting materials) must not be strongly bound to the atom rumps. Materials having a high electrical conductivity usually also have a high thermal conductivity (Wiedemann-Franz law), so that Z cannot be favorably influenced. Currently used materials such as $Bi_2Te_3$, PbTe or SiGe indeed represent compromises. For instance, the electrical conductivity is reduced less than the thermal conductivity by alloying. It is therefore preferable to use alloys such as e.g. $(Bi_2Te_3)_{90}(Sb_2Te_3)_5(Sb_2Se_3)_5$ or $Bi_{12}Sb_{23}Te_{65}$, as are described in U.S. Pat. No. 5,448,109.

For thermoelectric materials with high efficiency, it is also preferable to satisfy further constraints. Above all, they must be thermally stable so that they can work for years without substantial loss of efficiency at working temperatures of up to 1000 K. This entails phases which per se are stable at high temperatures, a stable phase composition, as well as negligible diffusion of alloy constituents into the adjoining contact materials and vice versa.

The recent patent literature contains descriptions of thermoelectric materials, for example U.S. Pat. No. 6,225,550 and EP-A-1 102 334. U.S. Pat. No. 6,225,550 relates essentially to materials constituted by $Mg_xSb_2$, which awe additionally doped with a further element, preferably a transition metal.

EP-A-1 102 334 discloses p- or n-doped semiconductor materials which represent an at least ternary material constituted by the material classes: silicides, borides, germanides, tellurides, sulfides and selenides, antimonides, plumbides and semiconducting oxides.

DE-A-101 42 624 relates to a thermoelectric generator of Peltier arrangement having a thermoelectrically active semiconductor material constituted by a plurality of metals or metal oxides, wherein the thermoelectrically active material is selected from a p- or n-doped ternary compound as semiconductor material. Specifically, compounds of the general formula $Me_xS^A_yS^B_z$ are disclosed with $S^A_y$=Ge and $S^B_z$=Te. Lead is not disclosed as a possible metal component.

The article "Thermoelectric properties of n-type $(Pb_{1-x}Ge_x)Te$ fabricated by hot pressing method", proceedings ICT '97, XVI International Conference on Thermoelectrics, Aug. 26-29, 1997, Dresden, pages 228 to 231 describes the behaviour of a $(Pb_{1-x}Ge_x)Te$ with x being from 0 to 0.15. The system is doped with 0.3% Bi. The material is obtained by charging the appropriate amounts of Pb, Ge and Te as well as Bi into a quartz tube. The inside wall of the quartz tube was carbon-coated by acetone cracking. The quartz tube was subsequently evacuated, sealed and heated to 1000° C. for 2 hours using a rocking furnace. Subsequently, the system was quenched to room temperature. The $(Pb_{1-x}Ge_x)Te$ ingots were then grown in a zone melting furnace at 1000° C. with a growth rate of 1 mm/min. Then, the ingots were crushed to powders of 90 to 250 µm size. A reduction treatment of the powders was conducted at 400° C. for 24 hours in a $H_2/Ar$ atmosphere. Then, the powders were cold-pressed and subsequently hot-pressed in vacuum for 1 hour at 650° C. and 750° C.

It was found that the Seebeck coefficient and the electrical resistivity increased with a Ge Te content x. The thermal conductivity was lowered with increasing the Ge Te content, The best Seebeck coefficient obtained was around −150 µV/K and the electrical resistance was about 1 mOhm cm. The thermal conductivity was around 2 W/m-K at minimum.

Referring to the literature, it was stated that the solubility of GeTe in PbTe is more than 20% at temperatures below 750° C. However, measurements were only conducted for x up to 0.15.

There is nevertheless still a need for thermoelectrically active materials which have a high efficiency and exhibit a suitable property profile for different application fields. Research in the field of thermoelectrically active materials can by no means yet be regarded as concluded, so that there is still a demand for different thermoelectric materials.

We have found that this object is achieved by a thermoelectrically active p- or n-conductive semiconductor material constituted by a ternary compound of the general formula (I)

$(Pb_{1-x}Ge_x)Te$             (I)

with x value from 0.16 to 0.5, wherein 0 to 10% by weight of the ternary compound may be replaced by other metals or metal compounds, wherein the semiconductor material has a Seebeck coefficient of at least ±200 µV/K at a temperature of 25° C. as well as a thermoelectric generator or a Peltier arrangement having this thermoelectrically active semiconductor material.

According to the present invention it has been found that a ternary compound $(Pb_{1-x}Ge_x)Te$ with x value from 0.16 to 0.5 shows much higher Seebeck-coefficient when the compound is obtained in a specific process as described below. The ternary compounds obtained according to the present invention have a Seebeck coefficient of at least ±200 µV/K at a temperature of 25° C.

Preferably, the Seebeck coefficient is at least 200 µV/K, especially preferred at least 240 µV/K. Typically, the Seebeck coefficient is in the range of from 200 to 300 µV/K, preferably in the range of from 250 to 300 µV/K at a temperature of 25° C.

From the prior art indicated above it could not be foreseen that the specific ternary compounds of the present invention obtained by the specific process according to the present invention show these much higher Seebeck coefficients.

Preferably, in the ternary compound of the general formula (I) x is a value from 0.17 to 0.25, especially preferred from 0.17 to 0.19. Particularly preferred is a value x of about 0.18. This value of 0.18 corresponds to a composition $Ge_2Pb_9Te_{11}$.

In the semiconductor material according to the present invention 0 to 10% by weight, preferably 0 to 5% by weight, especially 0 to 1% by weight of the ternary compound may be replaced by other metals or metal compounds which also may act as p- or n-dopants. Examples for other metals or metal compounds are Tl, Si, Sb, Bi, Se, Si, Mg and mixtures thereof, Mn, Na, K, Sb-halides, Pb-halides, Bi-halides.

According to one embodiment of the present invention, 0.05 to 1% by weight, more preferably 0.1 to 0.5% by weight of the ternary compound of the general formula (I) are replaced by p- or n-dopants. These p- or n-dopants are preferably selected from the group consisting of Sb, Sb-halides or Bi-halides. One specific example of an n-dopant is Bi which is preferably employed in an amount of from 0.1 to 0.5% by weight, based on the semiconductor material.

Other possible dopants are known to the person skilled in the art. The dopants and the other metals or metal compounds are selected in a way that the Seebeck coefficient of the material is preferably not adversely affected.

These other compounds or dopants may be included as long as the Seebeck coefficients as noted above are preserved.

The semiconductor materials of the present invention are prepared by melting together mixtures of the element powders of the constituents or of alloys thereof for at least 1 hour, subsequently rapidly cooling the melt at a rate of at least 10° C./s to a temperature which is at least 100° C. lower than the melting point of the semiconductor material, and subsequently annealing the semiconductor material at a temperature which is at least 100° C. tower than the melting point of the semiconductor material for at least 1 hour.

The melting together in the first reaction stage is preferably performed for at least 2 hours, more preferably at least 5 hours, most preferably at least 10 hours. The melting together may be performed with or without mixing of the melt. Fox example, the melt can be mixed using a rocking furnace to ensure the composition homogeneity. The time required for the melting together is dependent on the mixing of the components. If no mixing is performed, longer times for melting together are required to obtain a homogeneous material, whereas under good mixing conditions the homogeneity is obtained after shorter hours.

Without additional mixing a typical time for melting is from 2 to 50 hours.

The melting is performed at a temperature at which at least one of the components is molten and the semiconductor material or mixture is present in a molten state. For example, the temperature is at least 900° C., preferably at least 950° C. Typically, the temperature is in the range of from 800 to 1,000° C., preferably from 930 to 980° C.

After melting together the (homogeneous) molten mixture is rapidly cooled at at rate of at least 10° C./s, preferably at least 20° C./s, more preferably at least 100° C./s. The cooling is performed to a temperature which is at least 100° C. lower than the melting point of the semiconductor material, preferably at least 200° C. lower, more preferably at least 500° C. lower than the melting point of the semiconductor material. In a preferred embodiment the melt is rapidly cooled to room temperature (25° C.) or lower temperatures. For example the melt can be rapidly cooled by introducing it in an ice-water mixture. Other ways of rapidly cooling the melt are known to the person skilled in the art. Preferably, pressure is applied to the mixture upon cooling, e.g. from 50 to 10,000 bar.

After rapidly cooling (quenching) the melt, the semiconducting material is annealed at a temperature which is at least 100° C., preferably at least 200° C. lower than the melting point of the semiconductor material. A typical temperature can be in the range of from 450 to 650° C., preferably 500 to 600° C. The annealing is performed for at least 1 hour, more preferably at least 2 hours, more preferably at least 10 hours. A typical time would be in the range of from 10 to 250 hours, more preferably 20 to 100 hours. In a typical embodiment the annealing is performed at a temperature which is 100 to 500° C. lower than the melting point of the semiconductor material. A preferred temperature range is from 150 to 350° C. lower than the melting point of the semiconductor material.

In a specific process, the melt is rapidly cooled at a rate of at least 20° C./s to a temperature of 25° C. or lower and the semiconductor material is subsequently annealed at a temperature which is at least 150° C. lower than the melting point of the semiconductor material for at least 5 hours.

Without being bound to any theory, it is assumed that the annealing process is responsible for obtaining the high Seebeck coefficients in the semiconductor material of the present invention.

In a very specific embodiment the elements were reacted for two days at 950° C. in a quartz tube. Subsequently, the quartz-tube was immediately immersed in ice water. Subsequently, the material was annealed at 550° C. for seven days.

According to the state of the art; materials like $Bi_2Te_3$ or PbTe are produced by melting and reacting the components in a heated quartz tube. Mixing may be enhanced by rocking the heating furnace. After the reaction is completed the furnace is cooled down. Afterwards the quartz tube is removed and the thermoelectric material in the form of an ingot is cut into slices. These slices are sawn into the pieces of 3-5 mm length from which the thermoelectric module is built up.

Processing the material of this invention accordingly is prone to difficulties, especially if the absolute volume of the ingot is large. The ingots have to be cooled down rapidly (quenching). However, since quartz is a material with very low heat conductivity the cooling rate on quenching is rather low. In addition, the thermal expansion coefficient of the ingot is higher that that of quartz. Therefore the contact of the ingot to the wall of the quartz tube will loosen and thereby the cooling rate will be even lower. On the other hand high cooling rates cause high mechanical stresses within the ingot: While the outer layers of the ingot are already solidified the core inside is still liquid or at least on a higher temperature level. On further cooling the core material tends to shrink according to the thermal expansion coefficient thus generating mechanical stress. This effect is intensified by the inherent low thermal conductivity of the ingot—one of the major advantages of the material of this invention in the application—increasing mechanical stresses on quenching.

The mechanical stresses may cause flaws or cracks or may generate flaws or cracks in very early stages. These flaws or cracks lower the electrical conductivity of the material which is a disadvantage regarding the application of the material as a thermoelectrically active material.

In order to prevent the generation of flaws or cracks by quenching the material several techniques can be applied.

Instead of using a quartz tube which shows the difficulties described above, a tube made of a different material can be used, e.g. a tube of tantalum. This is advantageous as the thermal conductivity of the material is much higher than that of quartz. More importantly, the thermal expansion coefficient is higher than that of the material filled in the tube. Generally, the preferred material of the tube has a higher thermal expansion coefficient than the Pb—Ge—Te-compounds filled in the tube. Instead of tubes other containers (of appropriate shape) can be employed. By rapidly cooling the filled tube after the synthesis the tube shrinks to a higher degree than the material inside which results in a force acting from the outside to the inside across the cross section of the tube. Thus, a pressure is generated on the material by quenching the tube which counteracts the generation and propagation of flaws or cracks. By filling the tube to a high degree, an (unwanted) expansion perpendicular to the shrinking cross section may be hindered or prevented. The cooled material can then be cut or sawn into any shape eventually needed for the application.

In another technique the cooled material may be ground at ambient temperature to typical particle sizes lower than 10 μm. The ground material is pressed to parts having the desired shape. The apparent density of those pressed parts should exceed 50%, preferably 60%, of the bulk density of the material. Substances that improve the densification by pressing may be added in amounts of 0.1 to 5 Vol-%, preferably 0.2 to 2 Vol-% of the powdered material. Those additives must of course be inert to the thermoelectric material and vanish upon heating under inert conditions or in vacuum at temperatures below the sintering temperature. After pressing, the pressed parts are put into a sintering furnace where they are heated to a temperature up to 20° C. below the melting point. Thus the pressed parts are sintered to 95% to 100% of their theoretical (bulk) density. After sintering the parts are quenched by cooling down in an inert liquid like oil, liquefied ammonia, liquefied $SO_2$ or halogenated alkanes. By applying this procedure the volume jump that occurs on the transition from the liquid state to the solid state of the thermoelectric material at the transformation temperature is prevented.

In order to prevent the generation of flaws or cracks by quenching the molten material it is proposed to apply processes that result in better thermal contact during the quenching procedure and, more preferred, additionally allow for quenching and application of pressure simultaneously during the cooling. In one design/embodiment of the invention the melt, staying at a temperature above the melting point, is injected into moulds or cases yielding the final measures for the application, pressure die casting, a technology as it is for example used in the field of aluminum, magnesium or zinc pressure die casting. Thus the small thermoelectrically active parts are directly prepared in the right dimensions, ready to use. By this procedure the parts are quenched more rapidly than within a quartz tube because the ratio of surface that is effective for cooling compared to the volume of the pants is increased drastically compared to the case of the quartz tube. The applied pressure, preferrably in the range of 100 to 1.000 bars, counteracts the generation of flaws or cracks. The material is compressed on cooling and the outer layers are pressed against the core of the material. Since the volume is small compared to the volume of the overall ingot the absolute mechanical stresses on quenching are smaller.

It is also possible to run a continous process by pouring the melt into a cooling channel with dimensions according to the width and height of the final parts. The material solidifies within this channel. The solidified material (in the form of a bar) is removed from the channel by a plunger and transferred into a pressing mould which smoothly covers the bar and further cools it down. This process is well known in metals processing as continuous casting. In a preferred embodiment of the invention the melt is poured into the rectangular channel that is made up between two profiled and chilled rollers. These consist of a material of high thermal conductivity.

FIG. 1 shows a cross sectional view of this embodiment: Two profiled and chilled rollers form channels (ch) at the indicated positions. The chilled rollers turn in opposite rotation senses and the melt solidifies in one or more channels, the channel(s) becoming more and more narrow. The material is continuously quenched under increasing pressure, e.g. in the pressure range indicated above. The continuously produced bars are cut into the final parts.

When the preparation of the Pb—Ge—Te-compounds was performed without annealing, much lower Seebeck coefficients were obtained.

The electrical conductivity is essentially not severely affected by the annealing process.

The present invention also relates to a semiconductor material prepared by the above process.

Furthermore, the present invention relates to a thermoelectric generator of Peltier arrangement having a thermoelectrically active p- or n-conductive semiconductor material as defined above.

The thermoelectric generators and Peltier arrangements according to the invention enhance quite generally, on the one hand, the range of available thermoelectric generators and Peltier arrangements. Owing to the different chemical systems, it is possible to satisfy different requirements in various application fields of the thermoelectric generator or Peltier arrangements. The thermoelectric generators and Peltier arrangements according to the invention hence significantly extend the possibilities for application of these elements under different conditions.

The proportion of doping elements is up to 0.1 atom % in the alloy, or from $10^{18}$ to $10^{20}$ charge carriers per cubic centimeter. Higher charge-carrier concentrations cause disadvantageous recombinations, and hence a reduced charge mobility. The doping is carried out with elements which cause an electron surplus or deficit in the crystal lattice, e.g. with iodide for n-type semiconductors and alkaline-earth elements for p-type semiconductors.

A further possible way of doping is obtained if holes or electrons are deliberately introduced into the materials by means of super- or sub-stoichiometric compositions which obviates the need for an additional doping step.

Preferably, the p- or n-doping is carried out through selection of the quantitative proportions of the compounds, or the p-doping is carried with alkali metals and the n-doping with Sb, Bi, Te, Sb-halides or Bi-halides (see WO 92/13811).

The materials according to the invention are introduced into modules, as described e.g. in WO 98/44562, U.S. Pat. No. 5,448,109, EP-A-1 102 334 or U.S. Pat. No. 5,439,529, and these modules are connected in series.

The invention is further illustrated by the following examples:

EXAMPLE 1

Elemental powders in amounts corresponding to the formula $Ge_2Pb_9Te_{11}$, x=0.18 in formula (I) were introduced in a quartz tube. The total amount of material was 28 g.

The quartz tube was evacuated and sealed and subsequently heated to 950° C. for two days. Afterwards, the quartz tube vas immediately introduced in ice water and cooled down. Afterwards, the material obtained was annealed for seven days at 550° C.

Instead of a quartz tube all other inert materials may be employed in the melting process.

The material showed no phase transition. The melting point was 878° C., the optical band gap was 0.30 eV.

A 5 mm thick disk type sample was formed which was further used for characterization. The resistance was measured by a room temperature with a 4-probe instrument.

At room temperature the Seebeck coefficient was 285 to 330 µV/K, at 300° C. in the range of from 500 to 550 µV/K, at 430° C. 280 µV/K.

The electrical conductivity was 1000 S/cm.

At room temperature the lattice thermal conductivity was close to 0.8 W/m-K and thus very slow. The electronic thermal conductivity was about 1.1 W/m-K. Thereofore, the total was about 1.8 to 1.9 W/m-K.

EXAMPLE 2 (COMPARATIVE)

The same process as described in example 1 was carried out, but the sample was slowly cooled to room temperature over 12 hours and not annealed/tempered.

The material obtained showed a Seebeck coefficient of 240 to 250 µV/K at room temperature, 250 µV/K at 300° C. and −30 µV/K at 430° C.

Thus, it is evident that the annealing/tempering step of the present invention is important for obtaining a material having a high Seebeck coefficient.

The electrical conductivity was 1140 S/cm.

We claim:

1. A thermoelectric generator or Peltier arrangement having a thermoelectrically active p- or n-conductive semiconductor material constituted by a ternary compound of the general formula (I)

$(Pb_{1-x}Ge_x)Te$     (I)

with x value from 0.16 to 0.5,
wherein 0 to 10% by weight of the ternary compound may be replaced by other metals or metal compounds, wherein the semiconductor material has a Seebeck coefficient of at least ±240 µV/K at a temperature of 25° C.

2. A thermoelectric generator or Peltier arrangement as claimed in claim 1, wherein 0.05 to 1% by weight of the ternary compound of the general formula (I) are replaced by p- or n-dopants.

3. A thermoelectric generator or Peltier arrangement as claimed in claim 2, wherein the p- or n-dopants are selected from Na, K, Sb, Bi, Sb-halides, Bi-halides, Pb-halides, Mg, Mn, Tl, Se, Si and mixtures thereof.

4. A thermoelectric generator or Peltier arrangement as claimed in claim 1, wherein x has a value from 0.17 to 0.25.

5. A thermoelectrically active p- or n-conductive semiconductor material constituted by a ternary compound of the general formula (I)

$(Pb_{1-x}Ge_x)Te$     (I)

with x value from 0.16 to 0.5,
wherein 0 to 10% by weight of the ternary compound may be replaced by other metals or metal compounds, wherein the semiconductor material has a Seebeck coefficient of at least ±240 µV/K at a temperature of 25° C., and wherein 0.05 to 1% by weight of the ternary compound of the general formula (I) are replaced by p- or n-dopants.

6. A semiconductor material as claimed in claim 5, wherein the p- or n-dopants are selected from Na, K, Sb, Bi, Sb-halides, Bi-halides, Pb-halides, Mg, Mn, Ti, Se, Si and mixtures thereof.

7. A semiconductor material as claimed in claim 5, wherein x has a value from 0.17 to 0.25.

* * * * *